United States Patent [19]

Vollmann et al.

[11] Patent Number: 4,877,697

[45] Date of Patent: Oct. 31, 1989

[54] COLOR FILTER ARRAY FOR LIQUID CRYSTAL DISPLAY DEVICE

[75] Inventors: Hansjoerg W. Vollmann, Bad-Neuenhain, Fed. Rep. of Germany; George S. K. Wong, Fort Lee; Dennis Bellville, Phillipsburg, both of N.J.

[73] Assignees: Hoechst Aktiengesellschaft, Frankfurt, Fed. Rep. of Germany; Hiechst Celanese Corporation, Somerville, N.J.

[21] Appl. No.: 198,985

[22] Filed: May 26, 1988

[51] Int. Cl.$^4$ .................... C09K 19/00; G02F 1/13
[52] U.S. Cl. ........................ 430/20; 430/143; 430/142; 430/257; 430/175; 430/270; 430/293; 350/339 F
[58] Field of Search ............. 430/20, 143, 257, 293, 430/270; 350/339 F, 336

[56] References Cited

U.S. PATENT DOCUMENTS

| | | | |
|---|---|---|---|
| 3,904,411 | 9/1975 | Erickson et al. | 96/28 |
| 4,528,073 | 7/1985 | Sano et al. | |
| 4,650,738 | 3/1987 | Platzer et al. | 430/143 |
| 4,659,642 | 4/1987 | Platzer et al. | 430/143 |
| 4,673,253 | 6/1987 | Tanabe | 350/339 F |
| 4,678,285 | 7/1987 | Ohta et al. | |
| 4,690,511 | 9/1987 | Wantabe | 350/339 F |
| 4,725,517 | 2/1988 | Nakanowatari | 430/20 |

FOREIGN PATENT DOCUMENTS

| | | |
|---|---|---|
| 59-9639 | 9/1984 | Japan. |
| 61-45224 | 5/1986 | Japan. |
| 61-275729 | 5/1986 | Japan. |
| 2111285 | 6/1983 | United Kingdom. |
| 2142180 | 1/1985 | United Kingdom. |

*Primary Examiner*—Paul R. Michl
*Assistant Examiner*—Christopher D. RoDee
*Attorney, Agent, or Firm*—Plottel & Roberts

[57] ABSTRACT

A liquid crystal display having display filter elements in registration with display electrodes. The filters are produced using color proofing films which are imaged to produce a regular pattern of dots. Filter elements are illuminated by electrodes selection to produce changeable images.

20 Claims, 1 Drawing Sheet

COLOR FILTER ARRAY FOR LIQUID CRYSTAL DISPLAY DEVICE

BACKGROUND OF THE INVENTION

This invention relates to a color display panel in which a liquid crystal light switching array and a mosaic color filter are combined to form a liquid crystal display panel.

This display panel comprises a light switching array having a liquid crystal layer interposed between a pair of substrates, and a mosaic color filter provided on the light switching array.

The present invention especially relates to a method for manufacturing multicolored plates having fine and close pattern. The present invention also relates to a method for manufacturing a multicolor display device using a color filter.

One conventional method for manufacturing multicolored plates includes a coloring method utilizing surface diffusion of metal iron known as the so-called staining method, another coloring method comprises the printing and burning of low melting temperature glass frit and another coloring method utilizes printing ink containing organic polymer binder.

However, these conventional methods have various drawbacks. For instance the coloring method by printing has the drawback that the color layer is quite uneven and lacks clarity and therefore is not a good color layer. The staining method also has the drawback that the fabrication process is complicated by using strong heat and that the possible color tone is restricted though the surface of the substrate keeps its initial smoothness. In addition, these methods have the common drawback in making a fine multicolor pattern that they lack accuracy and that colors of different tones are mixed with each other at the boundary where the two different colors are divided in two portions.

Also known is a method for manufacturing multicolored plates by coloring anodically oxidized aluminum film which has the good points of smoothness of the colored layer, wide variety of possible color tone and easy fabrication.

This method comprises the steps of forming a thin film of aluminum on a base plate, changing this thin film of aluminum into a thin film of anodically oxidized material, coloring this thin film of anodically oxidized aluminum by use of organic or inorganic coloring materials and thereafter sealing the porosity on the surface of the anodically oxidized aluminum thin film so as to stablize the colored layer. Another method employs the photo-resist method or the sublimate transferring method utilizing thermal sublimation of a sublimate dye so as to divide the anodically oxidized aluminum thin film into different colors. The former method has the drawback that the fabrication process is complicated. The latter method has also the drawback that the possible color tone is limited due to a limited variety of the sublimated dyes and that a quite fine pattern is hard to obtain according to this method.

In manufacturing a multicolor display device with a color filter, it is difficult to coincide the pattern of the transparent electrode with the pattern of the color filter. The more fine and multicolored the patterns, the more difficult it becomes to coincide the patterns. The color filter can be formed by means of screen printing, photoresists or the like. In the case of screen printing, however, a pattern cannot be so finely made. Namely, the more the pattern is colored with several colors, the worse the precision of the printing portion is, and color shear occurs. In the case of a photoresist, a pattern can be made fine, but the processes are complicated.

The present invention uses a simplified method whereby display panels are produced with color proofing films applied in register with display electrodes.

SUMMARY OF THE INVENTION

The invention provides a method for producing a display device which comprises forming an array of display electrodes on a surface of a first panel; forming an array of colored filter elements on said first panel in register with said array of display electrodes; forming a counter electrode on a second panel; disposing the first and second panels spaced apart from one another with the display electrodes facing the counter electrode; and confining display material between the spaced first and second panels; wherein at least one of said panels and the electrode or electrodes on said panel is transparent and wherein said colored filter elements are formed by:

(A) providing a photosensitive element which comprises, in order:
  (i) a substrate having a release surface; and
  (ii) a photosensitive layer on said release surface, which photosensitive layer comprises a light sensitive component selected from the group consisting of negative working, polymeric diazonium compounds; positive working quinone diazide compounds; and photopolymerizable compositions; and a resinous binder composition, which composition contains a major amount of at least one resin selected from the the group consisting of a polyvinyl butyral polymer, a polyvinyl alcohol/vinyl acetate/vinyl acetal terpolymer and a styrene-maleic anhydride copolymer half ester; and at least one colorant; and
  (iii) an adhesive layer directly adhered to said colored photosensitive layer, which adhesive layer comprises a polyvinyl acetate polymer or vinyl acetate containing copolymer and which adhesive layer has a softening point in the range of from about 60° C. to about 180° C.; and (B) either
  (i) laminating said element with heat and pressure via said adhesive layer to one side of said first panel; and removing said substrate by the application of peeling forces; and imagewise exposing said photosensitive layer to actinic radiation; or
  (ii) imagewise exposing said photosensitive layer to actinic radiation; and laminating said element with heat and pressure via said adhesive layer to one side of said first panel; and removing said substrate by the application of peeling forces; or
  (iii) laminating said element with heat and pressure via said adhesive layer to one side of said first panel; and imagewise exposing said photosensitive layer to actinic radiation; and removing said substrate by the application of peeling forces; and then (C) removing the non-image areas of said photosensitive layer with a liquid developer, which removing is conducted at a temperature at which said adhesive layers are substantially non-tacky; and thereafter (D) optionally repeating steps A through C at least once whereby another photosensitive element having at least one different colorant is laminated onto the one of said first panel over the non-removed portions of the previously laminated photosensitive layer or layers.

DETAILED DESCRIPTION OF THE PREFERRED EMBODIMENT

Liquid crystal display panels are known in the art per se as demonstrated by the teachings of U.S. Pat. Nos. 3,840,695; 4,528,073; and 4,690,511 which are incorporated herein by reference.

Figure 1:
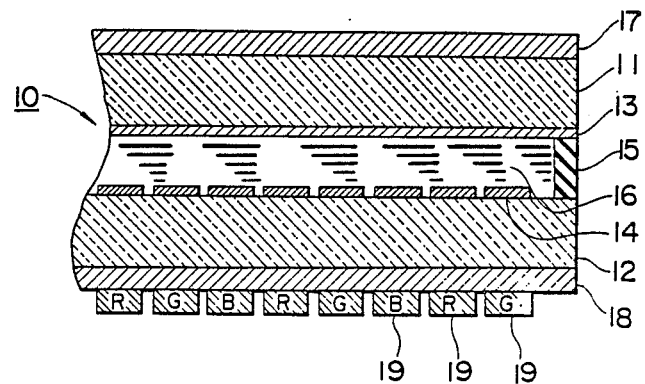
Figure 2:
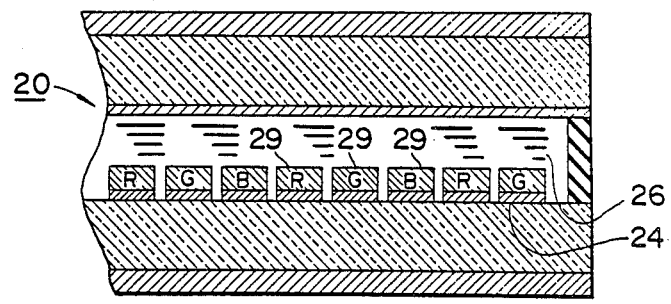

Referring now to FIGS. 1 and 2, prior art structures of liquid crystal color display panels will be discussed. FIG. 1 shows a liquid crystal color display panel 10 disclosed in U.S. Pat. No. 3,840,695. A front transparent plate 11 having a front transparent electrode 13 on the inner surface thereof, and a back transparent plate 12 having a back transparent electrode 14 with a mosaic array of dot electrodes on the inner surface thereof are arranged in parallel with each other, with a gasket 15 sandwiched therebetween.

A 90° twisted nematic liquid crystal layer 16 is interposed between the pair of transparent plates 11 and 12. The outer surface of the front transparent plate 11 is optionally provided with a front linear polarizer 17 and the outer surface of the back transparent plate 12 is provided with optional back linear polarizer 18 so that the polarization axes of the polarizers 17 and 18 are parallel with each other. On the outer surface of the back linear polarizer 18 is a mosaic color filter 19 with a mosaic array of red, green and blue filter elements in exact registration with the back transparent electrode 14. The display panel 10 is observed from the front (top of the figure) and may be illiminated by a light source (not shown) located at the rear (bottom of the figure). In the absence of an electric field across the liquid crystal layer 16, as the polarization plane of the polarized light passing through the back linear polarizer 18 is rotated 90° by the twisted nematic liquid crystal layer 16, the polarized light cannot pass through the front linear polarizer 17.

On the other hand, when a voltage is applied between the front transparent electrode 13 and the back transparent electrode 14, the twisted texture of the liquid crystal layer 16 is temporarily broken, and as a result, the polarized light passing through the back linear polarizer 18 is not modulated by the liquid crystal layer 16 and passes through the front linear polarizer 17. In this way, by driving selectively the mosaic transparent electrode 14 facing the mosaic color filter 19, red, green and blue light can be selectively observed. In an actual display panel, these color lights are combined to reproduce natural colors.

Now, assume that the display panel is observed at a distance of about three times as long as the width of the display panel from the front. Then the color disregistration at the peripheral edge of the panel becomes 1/6 of the distance between the liquid crystal layer 16 and the color filter 19. The minimum thickness of the transparent plate 12 is required to be about $500\mu$ from the viewpoint of its strength and the thickness of the polarizer 18 is usually about $100\mu$. Therefore, the above-mentioned distance is about $600\mu$. As a result, a color disregistration of about $100\mu$ cannot be avoided. In a high resolution color display panel having a mosaic filter densely deposited, such about $100\mu$ color disregistration is a serious problem. Shown in FIG. 2 is display panel 20 where the arrangement of the component parts is similar to that of FIG. 1 with the exception that a mosaic color filter 29 is directly coated on the surface of a back transparent electrode 24 with a mosaic array of dot electrodes.

In a display cell of the above construction, a display material which acts as an optical shutter, such as liquid crystal, electrochromic material or the like, is sandwiched and held between the substrates. When the shutter "opens", the color of the color filter is displayed: while, when the shutter "closes", the color of the color filter is masked and not shown. Accordingly, when the three primary colors are selected for the color filter, and the three primary colors are periodically patterned in a repeating manner a multicolor display can be made on a single cell. More specifically, to display red, only the optical shutter on the red pattern "opens" and the optical shutters on green and blue "close". To display yellow, the optical shutter on the red pattern and the green pattern "open" and the optical shutter on the blue green "closes". In the latter case, yellow is displayed by additive color mixture. If the color filter has an appropriate light transparency and the counter substrate is transparent, a similar effect is obtained if a luminous display material is sandwiched and held between the transparent substrate and the counter substrate and viewed from the direction of the counter substrate selection or non-selection is accomplished by impressing or not impressing a voltage upon a particular pattern of display electrodes via the counter electrode. Suitable panels non-exclusively include such transparent materials as glass and polymeric films. The electrode display array and counter electode may confine a material such as tin dioxide or indium tin dioxide. They may be applied in position and etched to the desired pattern by a method known in the art.

With respect to the arrangement of the mosaic color filter, in general, the tricolor filter elements of red (R), green (G) and blue (B) are arranged alternatively. However, an arrangement which interposes a black filter element X, that is, R-X-G-X-B-X-R-X. . . is available. As the twisted nematic liquid crystal layer, in general, a liquid crystal having a postive dielectric anistrophy is used. However, a liquid crystal having a negative dielectric anisotrophy is also usable, and in this case, in the presence of the electric field, the liquid crystal layer 26 is of a twisted structure and in the absence of the electric field, it is of a homeotropic structure.

When using a liquid crystal exhibiting a 90° twisted structure in the absence of the electric field, a pair of linear polarizers is generally arranged so that their polarization axes are parallel. Instead of this parallel arrangement, a perpendicular arrangement is available. In this case, the light switching property of the panel is reversed. In producing the colored filter elements of the invention one begins with a photographic element which is applied to the first panel, imaged and developed. The photographic element broadly comprises a substrate having a release surface, a colored photosensitive layer on the release surface and an adhesive layer on the photosensitive layer. Optional additional layers containing antihalation material adhesion promoters or release agents may also be used.

In the preferred embodiment, the substrate is composed of a dimensionally and chemically stable base material which does not significantly change its size, shape or chemical properties as the result of the heating, coating, or treatments which it must undergo. One preferred material is polyethylene terephthalate. In the usual case it has a thickness of from about 2-5 mils and most preferably from about about 2-3 mils. Suitable films include Hostaphan 3000, available from Hoechst Celanese Corporation, Mylar D, available from DuPont and Melinex grades 0; 052; 442; 516 and S, available from ICI.

The substrate must have a release surface, that is, it must be capable of releasably holding the photosensitive layer thereto. This may be accomplished either by the substrate surface being inherently releasable, being rendered releasable by a suitable treatment or being provided with a release layer over the substrate surface. Such a release layer may comprise polyvinyl alcohol.

Releasably bonded to the release surface is the photosensitive layer. The photosensitive layer broadly comprises a photosensitizer, a colorant, a binding resin, and other optional ingredients such as plasticizers, acid stabilizers, surfactants, antistatic compositions, uv absorbers and residual coating solvents.

In one embodiment, photosensitizer is preferably a light sensitive, negative working polymeric diazonium salt. The most preferred photosensitizer is the polycondensation product of 3-methoxy-4-diazo-diphenyl amine sulfate and 4,4'-bis-methoxy methyl-diphenyl ether, precipitated as mesitylene sulfonate as taught in U.S. Pat. No. 3,849,392. Other suitable photosensitizers are taught in U.S. Pat. No. 4,436,804. The diazo compounds of choice are preferably soluble in organic solvents.

In another embodiment, photosensitizer is preferably a light sensitive, naphthoquinone diazide. The most preferred photosensitizer is the ester of bis-(3-benzoyl-4,5,6 trihydroxy phenyl)-methane and 2-diazo-1-naphthol-5-sulfonic acid as taught in U.S. Pat. No. 4,407,926. Other suitable photosensitizers are taught in U.S. Pat. No. 4,266,001, 3,106,365, 3,148,983 and 3,201,239. The diazo compounds of choice are preferably soluble in organic solvents.

In yet another embodiment, the photosensitizer comprises a photopolymerizable monomer or oligomer component, and a photoinitiator. The photopolymerizable material contained in the color layer usually comprises an addition polymerizable, non-gaseous (boiling temperature above 100° C. at normal atmospheric pressure), ethylenically-unsaturated compounds containing at least two terminal ethylenic groups, and being capable of forming a high molecular weight polymer by free radical initiated, chain propagating addition polymerization. Suitable polymerizable materials non-exclusively include polybutane diol diacrylate, tetraethylene glycol dimethacrylate, ethylene glycol dimethacrylate, trimethylol propane trimethyacrylate, trimethylol propane triacrylate, polyethylene glycol (200) diacrylate, diethylene glycol dimethacrylate, pentaerythritoltetraacrylate, dicyclopentenyl acrylate, dicyclopentenyl methacrylate, 1,4 butanediol diacrylate, 1,6, hexanediol dimethacrylate, dipentaerythritol monohydroxypentaacrylate, ethoxylate bisphenol a dimethacrylate, and tripropylene glycol diacrylate.

Free radical liberating photoinitiators include any compound which liberates free radicals on stimulation by actinic radiation. Preferred photoinitiators non-exclusively include p-methoxy phenyl quinoxalin, 9-phenyl acridine, the vicinal poly ketaldonyl compounds described in U.S. Pat. No. 2,367,660; the alphacarbonyls described in U.S. Pat. No. 2,367,661 and 2,367,670; the acyloin ethers described in U.S. Pat. No. 2,448,828, the triarylimidazolyl dimer/p-amino-phenyl ketone combination described in U.S. Pat. No. 3,549,367 and the dye sensitized photolyzable organic halogen compounds described in U.S. Pat. No. 3,640,718 and 3,617,288 which are incorporated herein by reference.

Suitable binding resins include polyvinyl butyral and styrene maleic anhydride copolymer half esters and mixtures thereof. Such resins include Butvar B72, B76 and B90 and Scripset 540 and 550, respectfully, all available from Monsanto. An important resin selection criterion is that it must be a good film former.

Binders found suitable for this use are styrene/maleic anhydride polymers that can vary in monomer content at a ratio of from about 70/30 to about 95/5; polymethyl methacrylate/methacrylic acid copolymers having a ratio of monomers ranging from about 70/30 to 95/5; polymethyl methacrylate/ethyl acrylate/methacrylic acid copolymer having a ratio of monomers ranging from about 50/30/20 to about 90/5/5; polymethyl methacrylate/butyl acrylate/methacrylic acid copolymer having a ratio of monomers ranging from about 50/30/20 to about 90/5/5. Binders with no acid value but with the solubility characteristics to develop properly in the alkaline aqueous developers useful for the invention. Examples of this type of binder system non-exclusively include polyvinyl pyrrolidone polymers K-60 and K-90 (G.A.F.) cellulosic resins such as hydroxypropyl cellulose, methyl cellulose and ethyl hydroxy ethyl cellulose polymers. Additional binders non-exclusively include polyvinyl acetals such as polyvinyl butyral available as Butvar from Monsanto, and polyvinyl alcohols.

One preferred binding resin has the general formula

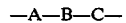

wherein a plurality of each of components A, B and C occur in ordered or random sequence in the resin and wherein A is present in said resin at about 5% to about 20% by weight and comprises groups of the formula

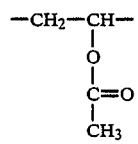

B is present in said resin at about 4% to about 30% by weight and comprises groups of the formula

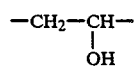

and C is present in said resin at about 50% to about 91% by weight and comprises acetal groups consisting of groups of the formulae

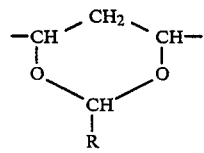

(I)

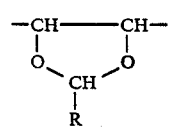

(II)

and

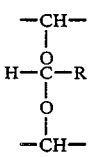

where R is lower alkyl or hydrogen, and wherein said group I is present in component C from about 75% to about 85%, group II is present in component C from about 3% to about 5%; and group III is present in component C from about 10% to about 22%; wherein said groups I, II and III are based on the number of acetal groups in component C. This composition is more fully described in U.S. Pat. No. 4,670,507 which is incorporated herein by reference.

Pigments or dyes may typically be included in the photopolymerizable composition to provide color to the image areas.

Preferred colorants for this invention are pigments and dyes. They are dispersed in a small amount of a suitable vehicle such as polymethyl methacrylate/methacrylic acid (85/15) and methyl ethyl ketone solvent.

Additional non-exclusive examples of colorants usable in the present invention are as follows: Benzidine Yellow G (C.I. 21090), Benzidine Yellow Gr (C.I. 21100), Permanent Yellow DHG (product of Hoechst AG), Brilliant Carmine 6B (C.I. 15850), Rhodamine 6G Lake (C.I. 45160), Rhodamine B Lake (C.I. 45170), Phthalocyanine Blue non-crystal (C.I. 74160), phthalocyanine Green (C.I. 74260), Carbon Black, Fat Yellow 5G, Fat Yellow 3G, Fat Red G, Fat Red HRR, Fat Red 5B, Fat Black HB, Zapon Fast Black RE, Zapon Fast Black G, Zapon Fast Blue HFL, Zapon Fast Red BB, Zapon Fast Red GE, Zapon Fast Yellow G, quinacridone Red (C.I. 46500).

In the practice of the present invention the binder component is preferably present in the photosensitive layer in an amount sufficient to bind the composition components in a uniform mixture and a uniform film when it is coated on a substrate. It is preferably present in an amount ranging from about 20% to about 90% based on the weight of the solids in the layer. A more preferred range is from about 30% to about 70% and most preferably from about 35% to about 65%.

In the preferred embodiment, when a diazonium salt or diazide compound is the photosensitizer component, it is present in the photosensitive layer in an amount of from about 5 to about 40% by weight; or more preferably from about 10 to about 35% by weight.

In the practice of the present invention when a photoinitiator compound is used, it is preferably present in the photosensitive layer in an amount sufficient to initiate the free radical polymerization of the unsaturated component upon exposure to imaging energy. It is preferably present in an amount ranging from about 1% to about 30% based on the weight of the solids in the layer. A more preferred range is from about 2% to about 20% and most preferably from about 3% to about 10%.

In the practice of the present invention the colorant component is preferably present in an amount sufficient to uniformly color the photosensitive layer It is preferably present in an amount ranging from about 5% to about 50% based on the weight of the solids in the layer. A more preferred range is from about 10% to about 40% and most preferably from about 15% to about 35%.

In the practice of the present invention when an unsaturated component is preferably present in the photosensitive layer in an amount sufficient to cause an imagewise latent differential in the polymerizable composition when it is coated on a substrate and imagewise exposed to imaging energy. It is preferably present in an amount ranging from about 10% to about 50% based on the weight of the solids in the layer. A more preferred range is from about 20% to about 40% and most preferably from about 25% to about 35%.

Other components which may be included in the light sensitive composition layer of this invention include acid stabilizers, exposure indicators, plasticizers and photoactivators.

Suitable acid stabilizers useful within the context of this invention include phosphoric, citric, benzoic, m-nitro benzoic, p(p-anilino phenylazo) benzene sulfonic acid, 4,4'-dinitro-2,2'-sti)bene disulfonic, itaconic, tartaric and p-toluene sulfonic acid and mixtures thereof. Preferably, the acid stabilizer is phosphoric acid. When used, the acid stabilizer is preferably present in the radiation-polymerizable composition in the amount of from about 0.3% to about 2.0%, and most preferably from about 7.5% to about 1.5%, although the skilled artisan may use more or less as desired. Exposure indicators (or photoimagers) which may be useful in conjunction with the present invention include 4-phenylazodiphenylamine, eosin, azobenzene, Calcozine Fuchine dyes and Crystal Violet and Methylene Blue dyes. Preferably, the exposure indicator is 4-phenylazodiphenylamine. The exposure indicator, when one is used, is preferably present in the composition in an amount of from about 0.001% to about 0.0035% by weight. A more preferred range is from about 0.002% to about 0.030% and, most preferably, the exposure indicator is present in an amount of from about 0.005% to about 0.20%, although the skilled artisan may use more or less as desired.

The photoactivator which may be included in the composition of this invention should be an amine-containing photoactivator which combines synergistically with the free-radical photoinitiator in order to extend the effective half-life of the photoinitiator, which is normally in the approximate range of about $10^{-9}$ to $10^{-15}$ seconds. Suitable photoactivators include 2-(N-butoxy) ethyl-4-dimethylamino benzoate, 2-(dimethylamino) benzoate and acrylated amines. Preferably the photoactivator is ethyl-4-dimethylamino benzoate. The photoactivator is preferably present in the photosensitive composition layer of this invention in an amount of from about 1.0% to about 4.0% by weight, although the skilled artisan may use more or less as desired.

A plasticizer may also be included in the composition of this invention to prevent coating brittleness and to keep the composition pliable if desired.

Suitable plasticizers include dibutylphthalate, triarylphosphate and substituted analogs thereof and, preferably dioctylphthalate. The plasticizer is preferably present in the composition of this invention in an amount of from about 0.5% to about 1.25% be weight, although the skilled artisan may use more or less as desired.

To form a coating composition for the production photographic elements, the composition of this invention may be dissolved in admixture in a solvent or mixture of solvents to facilitate application of the composition to the substrate. Suitable solvents for this purpose include water, tetrahydrofuran, butyrolactone, glycol ethers such as propylene glycol monomethyl ether and methyl Cellosolve, alcohols such as ethanol and n-propanol and ketones such as methyl ethyl ketone, or mixtures thereof. Preferably, the solvent comprises a mixture of tetrahydrofuran, propylene glycol, monomethyl ether and butyrolactone. In general, the solvent system is evaporated from the coating composition once it is applied to an appropriate substrate, however, some insigificant amount of solvent may remain as residue.

In the preferred embodiment, the photosensitive layer has a coating weight between approximately 0.1 and 5.0 g/m². The most preferred weight is from about 0.5 to 2.0 g/m².

The adhesive layer on the photosensitive layer preferably comprises polyvinyl acetate or vinyl acetate containing copolymers such as UCAR VYNC and may optionally contain such other desired components as uv absorbers, antistatic compositions and plasticizers. Useful polyvinyl acetates non-exclusively include Mowilith DM-6, 20, DM-22, 25, 30 and mixtures thereof, available from Hoechst AG. These are usually dispersed in water, or dissolved in methyl isobutyl ketone or n-butyl acetate or other solvent compositions for coating on the photosensitive layer. It is then dried to a coating weight of from about 5 to about 30 g/m², more preferably from about 10 to about 20 g/m² The layer may optionally contain a uv absorber such as Uvinul D-50 from G.A.F. It may also contain a plasticizer such as Resoflex R-296, available from Cambridge Industries. It may also contain antistats, such as Gafac and Gafstat from G.A.F. It may also contain other resins such as Nitrocellulose RS ½, available from Hercules. The adhesive layer should not be tacky to the touch, during storage or during development of the photosensitive element. The layer should have a softening point in the range of from about 60° C. to about 180° C., preferably 60° C. to 120° C., more preferably 60° C. to 100° C. In the preferred embodiment, the polyvinyl acetate is present in the adhesive layer in an amount of greater than about 50% by weight. The plasticizer may be present in an amount of up to about 30% by weight, the uv absorber up to about 20% by weight, and other resins up to about 50% by weight.

Typical adhesive formulations non-exclusively include.

| I. | |
|---|---|
| Water | 50.00 |
| Mowilith DM—22 | 50.00 |
| II. | |
| n-butyl acetate | 78.00 |
| Resoflex R—296 | 1.00 |
| Mowilith 25 | 21.00 |
| III. | |
| n-butyl acetate | 68.70 |
| Uvinul D—50 | 1.30 |
| Mowilith 20 | 30.00 |

In operation, the photosensitive element is laminated to the one side of the first panel via the adhesive layer on the photosensitive element.

Lamination may be conducted by putting one side of the first panel in contact with the adhesive side of the colored composite and then introducing the two materials into the nip of a pair of heated laminating rollers under suitable pressure. Suitable laminating temperatures usually range from about 60° C. to about 90° C., preferably about 75° C. to about 85° C. After lamination, the substrate is peeled away, usually merely employing manual peeling forces. The adhesive and photosensitive layers thus remain on the first panel.

The photosensitive layer is imagewise exposed by means well known in the art either before or after lamination. Such exposure may be conducted by exposure to a uv light source through a photomask under vacuum frame conditions.

Exposure may be performed with actinic light through a conventional separation flat. Exposures after lamination and peel apart are preferred for emulsion-to-emulsion contact. Mercury vapor discharge lamps are preferred over metal halide lamps. Filters may be used to reduce light scattering in the material.

After lamination, peel apart of the substrate and exposure, the photosensitive layer is developed by dissolving the non-exposed area in a suitable developer and dried. The adhesive layer is not removed by this development. Suitable developers non-exclusively include:

| I. | |
|---|---|
| water | 95.0 |
| sodium decyl sulphate | 3.0 |
| disodium phosphate | 1.5 |
| sodium metasilicate | 0.5 |
| II. | |
| water | 89.264 |
| monosodium phosphate | 0.269 |
| trisodium phosphate | 2.230 |
| sodium tetradecyl sulfate | 8.23 |

Any developer solution which satisfactorily removes the non-image areas of the photosensitive layer after exposure while retaining the image areas may be used. The selection of developer is well within the ability of the skilled artisan.

The process can then be repeated whereby another photosensitive element having a different color is laminated to the same panel over the previously formed image. In the usual case, four colored layers are employed to produce pattern of dots which when illuminated and properly selected by the electrodes is capapable of producing a full color reproduction of a desired image These are red, green, blue and black.

What is claimed is:

1. A method for producing a display device which comprises forming an array of display electrodes on a surface of a first panel; forming an array of colored filter elements on either side of said first panel in register with said array of display electrodes; forming a counter electrode on a second panel; disposing the first and second panels spaced apart from one another with the display electrodes facing the counter electrode; and confining display material between the spaced first and second panels; wherein at least one of said panels and the electrode or electrodes on said panel is transparent and wherein said colored filter elements are formed by:
   (A) providing a colored photosensitive element which comprises, in order:
   (i) a substrate having a release surface; and
   (ii) a photosensitive layer on said release surface, which photosensitive layer comprises a light sensitive component selected from the group consisting of negative working, polymeric diazonium compounds, positive working quinone diazide compounds; and photopolymerizable compositions; and a resinous binder composition, which composition contains a major amount of at least one resin selected from the the group consisting of a polyvinyl butyral polymer, a polyvinyl alcohol/vinyl acetate/vinyl acetal terpolymer and a styrene-maleic anhydride copolymer half ester; and at least one colorant; and (iii) an adhesive layer directly adhered to said colored photosensitive layer, which adhesive layer comprises a polyvinyl acetate polymer or vinyl acetate containing copolymer and which adhesive layer has a softening point in the range of from about 60° C. to about 180° C.; and (B) either (i) laminating said element with heat and pressure via said adhesive layer to one side of said first panel and removing said substrate by the application of peeling forces; and imagewise exposing said photosensitive layer to actinic radiation; or (ii) imagewise exposing said photosensitive layer to actinic radiation; and laminating said element with heat and pressure via said adhesive layer to one side of first panel; and removing said substrate by the application of peeling forces; or (iii) laminating said element with heat and pressure via said adhesive layer to one side of said first panel; and imagewise exposing said photosensitive layer to actinic radiation; and removing said substrate by the application of peeling forces; and then (C) removing the non-image areas of said photosensitive layer with a liquid developer, which removing is conducted at a temperature at which said adhesive layers are substantially non-tacky; and thereafter (D) optionally repeating steps A through C at least once whereby another photosensitive element having at least one different colorant is laminated onto one side of said first panel over the non-removed portions of the previously laminated photosensitive layer or layers.

2. The method of claim 1 wherein said substrate comprises polyethylene terephthalate.

3. The method of claim 1 wherein said release surface on said substrate comprises polyvinyl alcohol.

4. The method of claim 1 wherein said photosensitive layer comprises the polycondensation product of 3-methoxy-4-diazo-diphenyl amine sulfate and 4,4'-bis-methoxy methyl-diphenyl ether precipitated as mesitylene sulfonate.

5. The method of claim 1 wherein said photosensitive layer comprises the ester of bis-(3-benzoyl-4,5,6 trihydroxy phenyl)-methane and 2-diazo-1-naphthol-5-sulfonic acid.

6. The method of claim 1 wherein said photosensitive layer comprises a photoinitiator and a photopolymerizable acrylate or methacrylate.

7. The method of claim 1 wherein said photosensitive layer comprises one or more photoinitiators selected from the group consisting of p-methoxy phenyl quinoxalin and 9-phenyl acridine.

8. The method of claim 1 wherein said photosensitive layer comprises one or more compounds selected from the group consisting of polybutane diol diacrylate, tetraethylene glycol dimethacrylate, ethylene glycol dimethacrylate, trimethylol propane trimethyacrylate, trimethylol propane triacrylate, polyethyene glycol (200) diacrylate, diethylene glycol dimethacrylate, pentaerythritol tetraacrylate, dicyclopentenyl acrylate, dicyclopentenyl methacrylate, 1,4 butanediol diacrylate, 1,6, hexanediol dimethacrylate, dipentaerythritol monohydroxypentaacrylate, ethoxylated bisphenol A dimethacrylate, and tripropylene glycol diacrylate.

9. The method of claim 1 wherein said photosensitive layer comprises one or more binders selected from the group consisting of polyvinyl acetals; styrene/maleic anhydride copolymer; and polymethyl methacrylate/methacrylic acid copolymer.

10. The method of claim 1 wherein said resinous binder resin comprises a compound having the general formula $$—A—B—C—$$

wherein a plurality of each of components A, B and C occur in ordered or random sequence in the resin and wherein A is present in said resin at about 5% to about 20% by weight and comprises groups of the formula

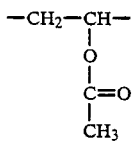

B is present in said resin at about 4% to about 30% by weight and comprises groups of the formula

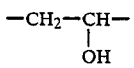

and C is present in said resin at about 50% to about 91% by weight and comprises acetal groups consisting of groups of the formulae

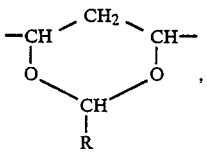 (I)

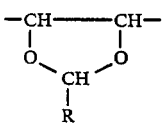 (II)

and

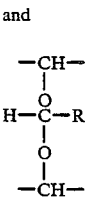 (III)

where R is lower alkyl or hydrogen, and wherein said group I is present in component C from about 75% to about 85%, group II is present in component C from about 3% to about 5%; and group III is present in component C from about 10% to about 22%; wherein said groups I, II and III are based on the number of acetal groups in component C.

11. The method of claim 1 wherein said photosensitive layer comprises one or more ingredients selected from the group consisting of plasticizers, acid stabilizers, antistatic compositions, uv absorbers, dyes, pigments and surfactants.

12. The method of claim 1 wherein said adhesive layer of the photosensitive element further comprises a plasticizer.

13. The method of claim 1 wherein each of said panels are transparent.

14. The method of claim 1 wherein said first and second panels comprise a material selected from the group consisting of glass polyester, cellulose acetate esters, polycarbonate, polyacrylic, polyvinyl resins, olefinic resins and polysiloxane resin.

15. The method of claim 1 wherein the laminating step is conducted at a temperature of from about 60° C. to about 90° C.

16. The method of claim 1 further comprising the subsequent step of attaching a polarizer to each of said first and second panels.

17. The method of claim 1 wherein each of said panels and electrodes are transparent.

18. The method of claim 1 wherein said electrodes comprise tin dioxide or indium tin dioxide.

19. The method of claim 1 wherein said display material is a liquid crystal material.

20. A display device produced by the method of claim 1.

* * * * *